(12) United States Patent
Cauchi et al.

(10) Patent No.: US 6,881,524 B2
(45) Date of Patent: *Apr. 19, 2005

(54) PHOTOLITHOGRAPHY METHOD INCLUDING A DOUBLE EXPOSURE/ DOUBLE BAKE

(75) Inventors: John Cauchi, Sunnyvale, CA (US); Eric Lou, San Jose, CA (US)

(73) Assignee: ProMOS Technologies, Inc., Hsin-Chu (TW)

(*) Notice: Subject to any disclaimer, the term of this patent is extended or adjusted under 35 U.S.C. 154(b) by 156 days.

This patent is subject to a terminal disclaimer.

(21) Appl. No.: 10/306,397

(22) Filed: Nov. 27, 2002

(65) Prior Publication Data

US 2004/0101790 A1 May 27, 2004

(51) Int. Cl.[7] .............................. G03F 9/00; G03F 7/20
(52) U.S. Cl. .......................... 430/5; 430/330; 430/394; 430/322
(58) Field of Search ........................... 430/5, 322, 330, 430/394

(56) References Cited

U.S. PATENT DOCUMENTS

| | | | |
|---|---|---|---|
| 5,407,785 A | * 4/1995 | Leroux | 430/312 |
| 5,631,112 A | 5/1997 | Tsai et al. | 430/22 |
| 5,663,893 A | 9/1997 | Wampler et al. | 716/19 |
| 5,863,712 A | 1/1999 | Von Bunau et al. | 430/396 |
| 6,280,887 B1 | 8/2001 | Lu | 430/5 |
| 6,301,008 B1 | 10/2001 | Ziger et al. | 356/401 |
| 6,311,319 B1 | 10/2001 | Tu et al. | 716/19 |

OTHER PUBLICATIONS

Handbook of Microlithography, Micromachining, and Microfabrication; vol. 1: Microlithography, Editor P. Rai–Choudhury; (1997), p. 79.

* cited by examiner

*Primary Examiner*—Kathleen Duda
(74) *Attorney, Agent, or Firm*—Michael Shenker; MacPherson Kwok Chen & Heid LLP; James E. Parsons

(57) ABSTRACT

A photoresist exposure process is disclosed which produces features which are substantially smaller than the aperture dimension of the mask used to make the feature. The smaller feature size results from a double exposure of the photoresist, combined with a double baking process to create the features in the photoresist. The double baking process thins the layer of photoresist, prior to the second exposure, thereby improving the resolution of the mark created by the second exposure on the photoresist. The process also uses a binary bias mask through which the first exposure is made, which overlaps with the area of the second exposure, to allow a process tolerance for the realignment of the mask over the wafer for the second exposure.

32 Claims, 4 Drawing Sheets

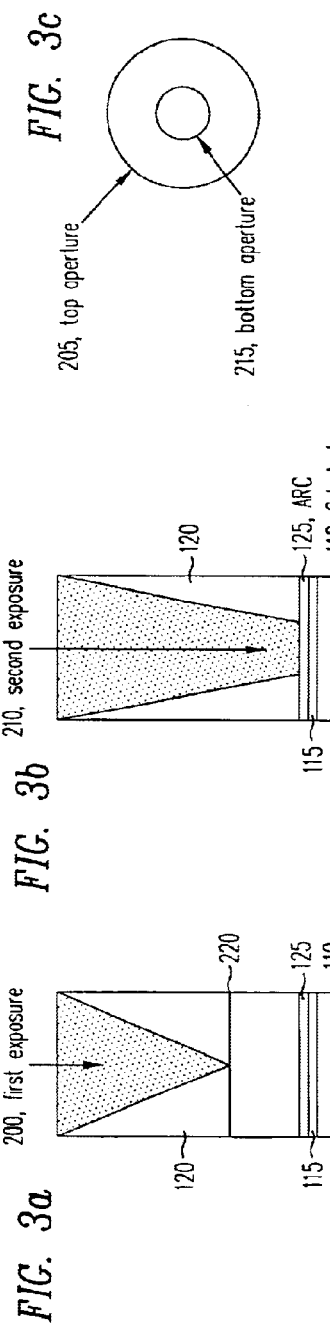

FIG. 4a

Wafer 1 — Single Exposure

| Focus (μm) \ Exposure (mJ/cm²) | 11 | 12.5 | 14 | 15.5 | 17 | 18.5 | 20 | 21.5 | 22 |
|---|---|---|---|---|---|---|---|---|---|
| -0.2 | 0.134 | | | | | | | | |
| -0.1 | 0.115 | 0.142 | 0.123 | 0.143 | 0.155 | 0.169 | 0.179 | | |
| 0.0 | NA | NA | 0.150 | 0.152 | 0.174 | 0.178 | 0.188 | 0.203 | 0.206 |
| 0.1 | NA | 0.133 | 0.152 | 0.162 | 0.169 | 0.184 | 0.198 | 0.207 | 0.209 |
| 0.2 | | NA | 0.152 | 0.161 | 0.172 | 0.185 | 0.192 | 0.209 | 0.210 |
| 0.3 | | NA | 0.117 | 0.152 | 0.170 | 0.183 | 0.201 | 0.210 | 0.208 |
| 0.4 | | NA | 0.122 | 0.149 | 0.151 | 0.166 | 0.172 | 0.177 | |
| 0.5 | | | 0.086 | NA | 0.118 | 0.159 | 0.161 | 0.170 | |

FIG. 4b

BARE SILICON — Binary Reticle, 0.88 μm space size on mask — 0.22 μm on wafer, 4x reduction

| Focus (μm) \ Exposure (mJ/cm²) | 26 | 27.5 | 29 | 30.5 | 32 | 33.5 | 35 | 36.5 | 38 |
|---|---|---|---|---|---|---|---|---|---|
| -0.2 | 0.120 | 0.140 | 0.137 | NA | NA | NA | NA | | |
| -0.1 | 0.127 | 0.127 | NA | 0.157 | 0.127 | 0.155 | 0.173 | 0.198 | 0.197 |
| 0.0 | 0.122 | NA | 0.141 | 0.139 | 0.170 | 0.190 | 0.202 | 0.209 | 0.213 |
| 0.1 | | NA | 0.150 | 0.162 | 0.182 | 0.197 | 0.210 | 0.210 | 0.216 |
| 0.2 | | NA | 0.148 | 0.146 | 0.168 | 0.188 | 0.207 | 0.211 | 0.193 |
| 0.3 | | 0.120 | 0.120 | 0.131 | 0.147 | 0.169 | 0.184 | 0.187 | |
| 0.4 | | | | | | NA | 0.108 | 0.145 | |
| 0.5 | | | | | | | | | |

BW FEM CD measurement
17, 0.1F First/18.5, 0.1F Second
800 A Poly
Binary Reticle, 0.88 μm space size on mask−0.22 μm on wafer, 4x reduction 0.540/0.078 UV6 on AR2  03/21/2002
0.63NA/0.80−0.50  Process Latitude ▭ 0.190 μm

Wafer 1

| Focus | 16.5 | 17 | 17.5 | 18 | 18.5 | 19 | 19.5 | 20 | 20 |
|---|---|---|---|---|---|---|---|---|---|
| −0.2 |  |  |  |  |  |  |  |  |  |
| −0.1 |  |  |  |  |  |  |  | 0.198 |  |
| 0.0 | 0.164 |  | 0.164 | 0.167 | 0.175 | 0.186 | 0.189 | 0.206 | 0.20 |
| 0.1 | 0.171 | 0.172 | 0.176 | 0.182 | 0.183 | 0.195 | 0.190 | 0.207 | 0.20 |
| 0.2 | 0.171 | 0.175 | 0.186 | 0.189 | 0.191 | 0.201 | 0.196 | 0.203 | 0.20 |
| 0.3 | 0.164 | 0.180 | 0.186 | 0.185 | 0.191 | 0.198 | 0.198 | 0.185 | 0.19 |
| 0.4 |  | 0.176 | 0.169 | 0.178 | 0.187 | 0.189 | 0.190 | 0.165 |  |
| 0.5 |  | 0.163 | 0.168 | 0.181 | 0.167 | 0.173 | 0.175 |  |  |
|  |  | 0.152 | 0.152 | 0.146 | 0.150 | 0.162 | 0.169 |  |  |
|  |  |  | 0.131 | 0.137 | 0.123 | 0.143 | 0.133 |  |  |

Wafer 2

| Focus | 16.5 | 17 | 17.5 | 18 | 18.5 | 19 | 19.5 | 20 | 20 |
|---|---|---|---|---|---|---|---|---|---|
| −0.2 |  |  |  |  |  |  |  |  |  |
| −0.1 |  |  |  |  |  |  |  | 0.195 |  |
| 0.0 | 0.153 |  | 0.160 | 0.170 | 0.167 | 0.177 | 0.182 | 0.198 | 0.20 |
| 0.1 | 0.179 | 0.175 | 0.171 | 0.177 | 0.190 | 0.189 | 0.198 | 0.205 | 0.21 |
| 0.2 | 0.175 | 0.177 | 0.188 | 0.187 | 0.192 | 0.197 | 0.204 | 0.203 | 0.20 |
| 0.3 | 0.154 | 0.170 | 0.184 | 0.184 | 0.193 | 0.201 | 0.212 | 0.185 | 0.19 |
| 0.4 |  | 0.164 | 0.176 | 0.172 | 0.187 | 0.190 | 0.199 | 0.153 |  |
| 0.5 |  | 0.143 | 0.153 | 0.163 | 0.163 | 0.172 | 0.184 |  |  |
|  |  |  | 0.149 | 0.135 | 0.150 | 0.163 | 0.171 |  |  |
|  |  |  | 0.108 | 0.133 | 0.135 | 0.131 | 0.140 |  |  |

*FIG. 6*

PHOTOLITHOGRAPHY METHOD INCLUDING A DOUBLE EXPOSURE/ DOUBLE BAKE

FIELD OF THE INVENTION

The present invention includes a photolithographic process for printing integrated circuit structures on the surface of a substrate.

BACKGROUND OF THE INVENTION

Photolithography is widely used to form patterns on semiconductor wafers during fabrication of integrated circuits. A semiconductor wafer 110 (FIG. 1) including an optional topmost layer 115 is coated with a photoresist layer 120. Photoresist 120 is irradiated from a light source 130 through an annular aperture 160. A mask or reticle 140 is placed between source 130 and photoresist 120. Binary mask 140 carries a pattern consisting of opaque and clear features. This pattern defines which areas of photoresist 120 are exposed to the light from source 130. After the exposure, the photoresist 120 is developed so that some of the photoresist is removed to uncover the underlying surface of layer 115 on substrate 110. If the photoresist is "positive," then the photoresist is removed where it was exposed to the light. If the photoresist is "negative," the photoresist is removed where it was not exposed. In either case, the remaining photoresist and the exposed (uncovered) areas of substrate 110 reproduce the pattern on mask 140. The wafer is then processed as desired (e.g., the exposed areas of layer 115 and/or substrate 110 can be, for example etched, coated, plated, or implanted with a dopant, among other possibilities.)

There is a trend in the semiconductor industry to have ever smaller feature sizes, while at the same time there is a desire to use existing photolithography equipment for new generations of semiconductors. In general, the minimum feature width of the patterned area is limited by the wavelength of the particular light source used, due to diffraction effects. That is, light diffracts around the edges of an aperture, so that the rays spread out from the source before being incident on the substrate. Therefore, the feature dimensions become poorly defined, when the aperture is smaller than, or on the order of, the wavelength of the light used to illuminate the pattern.

A number of techniques exist for improving the shape of the edge features which determine the minimum feature dimension which a particular light source is capable of creating on the substrate. One technique involves using a half-tone mask, which employs areas which are partially transmissive, to create destructive interference at the boundaries of the illuminated feature. The interference causes a sharpening of the feature boundary, compared to what its shape would be using a binary mask, that is, one with areas that are either fully transmissive or fully opaque. Half-tone masks, however, are about twice as expensive as binary masks.

Accordingly, because of the need to create ever smaller integrated circuit (IC) devices, a method that can further reduce the feature size that can be made by a given light source on a substrate would be of great commercial benefit.

SUMMARY

Embodiments of the invention involve, among other things, double-exposing a photoresist mask and substrate to an incident radiation source (e.g., a light source). The first exposure is applied with an incident energy which is sufficient to convert the upper portion of the photoresist to its transparent state, but not in the lower portion of the photoresist, as the intensity drops to below an energy threshold deeper in the film. A second, subsequent exposure, defines the final aperture in the film, and is narrower than the initial, latent print of the light on the film made by the first exposure. The second exposure defines a narrower region because it traverses the latent image made by the first exposure, which is a cone-shaped feature made in the film, in which the inner portion of the cone has been converted to its transparent state. Therefore, inner portions of the second beam, which traverse the transparent portion of the cone, are attenuated less effectively than outer portions of the second beam, and therefore maintain the threshold intensity required to convert a corresponding inner portion of the photoresist to its transparent state. The outer portions of the second beam, which are more attenuated, gradually fail to convert the photoresist. A net result is a feature in the photoresist that is smaller than what normally could be produced using the light source.

The embodiments may also include the use of two photoresist baking steps in addition to the two exposure steps in the photoresist processing. The first baking step takes place after the first exposure, and the second baking step takes place after the second exposure. The two baking steps evaporate moisture from the film, causing the film to shrink slightly, and activate a photo acid generator (PAG) in the photoresist film. The thinner remaining film may require less incident light intensity in the second exposure to convert the photoresist, and the aperture in the photoresist may be widened slightly by the activation of the PAG. Because the photoresist film is thinner, it attenuates a smaller proportion of the incident light beam throughout its depth. Therefore, the variability of the incident energy, as a function of depth in the photoresist film, is narrower. As thinner films may have a smaller variability than thicker films, they may result in a wider process window. A wider process window is important in designing a capable process, which generates repeatable results in the face of some variability in input parameters.

The embodiments may include use of a binary bias mask during one or both of the exposure steps, whose features have a wider diameter than the eventual feature size on the surface of the photoresist. The bias mask allows an area to be illuminated which is larger than the eventual feature size. Therefore, the bias mask may allow some misregistration of the wafer in the second exposure, compared to its position in the first exposure, as a process tolerance for the double exposure procedure.

These and other features of the present invention will be illustrated further by the following detailed description, and the accompanying drawings of the exemplary embodiments.

BRIEF DESCRIPTION OF THE DRAWINGS

FIG. 3a is a cross-sectional side view of the photoresist after a first exposure step, and FIG. 3b is a cross-sectional side view of the photoresist after a second exposure step. FIG. 3c is a top plan view of the photoresist of FIG. 3b.

FIG. 4a shows data taken on a wafer, with a double exposure/double bake photoresist process applied. FIG. 4b shows data taken on a wafer, with a single exposure/single bake process applied.

FIG. 5 shows data taken on a wafer, with a single exposure/double bake photoresist process applied.

FIG. 6 shows data taken on a wafer, with a double exposure/double bake photoresist process applied, according to the present invention.

DETAILED DESCRIPTION

Figure 1:
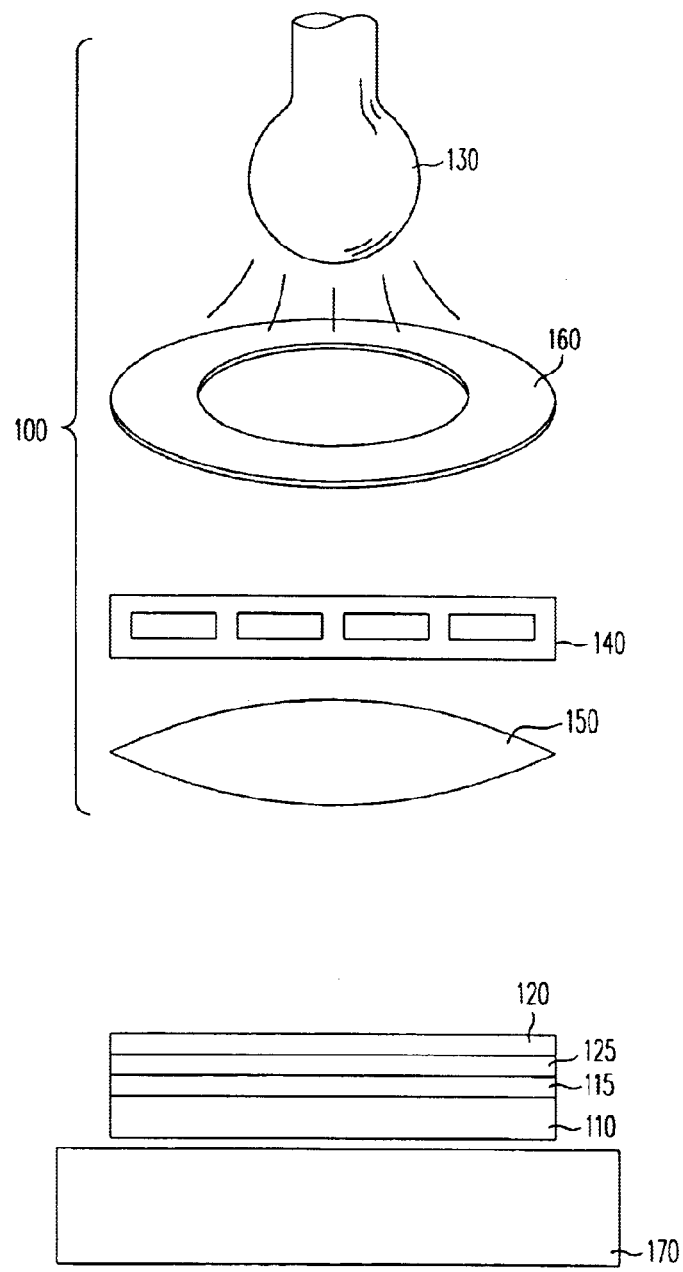
FIG. 1 is a side view of a photoresist exposure system suitable for some embodiments of the present invention.

The schematic diagram shown in FIG. 1 shows elements of an exemplary photolithography apparatus 100 suitable for practicing the invention. The apparatus includes an illumination source 130, a binary mask 140, an adjustable stage 170 for holding a substrate 110, a 4× reduction lens 150, and an annular aperture 160. The 4× reduction lens 150 is included which will project an image of the binary mask 140 on a layer of photoresist 120 deposited on the substrate 110. The projected image is, in this example, four times smaller than the physical features in the binary mask 140.

The annular aperture 160 blocks the center of an illumination beam from the illumination source 130, while allowing the outer ring diameter of the beam to pass. This is done because the outer portions of the incident beam are more collimated than the inner portions, and therefore they can be focused more effectively. Using the more collimated outer portion of the beam reduces the feature size that the beam can create. For example, in the present embodiment the annular aperture is $0.8_{outer}/0.5_{inner}$, where $0.8_{outer}$ refers to the diameter of the outer (transparent) ring of the annular aperture and $0.5_{inner}$ refers to the diameter of the inner (opaque) ring of the annular aperture. Since the inner ring is opaque, this annular aperture 160 blocks ⅝ of the incident light in this embodiment.

Figure 2:
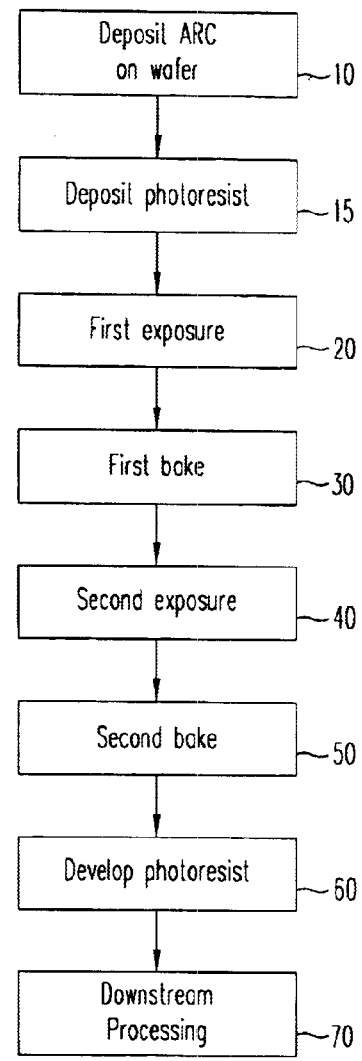
FIG. 2 shows a simplified flow chart of an exemplary process according to this invention.

The substrate 110 in FIG. 1, which may be a bare semiconductor wafer, or as shown may have a topmost layer 115, which is subjected to the process of FIG. 2. Topmost layer 115 may be a conductive or insulative layer. A second layer of anti-reflective coating 125 is deposited on topmost layer 115, followed by a layer of photoresist 120. The photoresist layer 120 will be patterned and processed, to form a photoresist mask, which will be used to further process the first layer 115 and/or substrate 110, by, for example, etching, deposition, plating or ion implantation.

The lithographic processing that will be applied to the substrate 110, is shown in the simplified flow chart of FIG. 2. In this process, a photoresist mask, including holes for forming contacts in semiconductor substrate 110 is produced. However, as will be apparent to those skilled in the art, the method of FIG. 2 can be applied to other shapes and patterns to be produced on a photoresist mask. Substrate 110 is prepared by initially depositing a layer of anti-reflective coating, followed by depositing 15 the layer of photoresist. The photoresist is then exposed (step 20) to incident radiation at an energy less than the minimum threshold energy. The minimum threshold energy is defined as the radiation dose needed to "convert" a pattern in the photoresist, that is to render the photoresist material transparent and/or soluble in the developing process.

The first exposure step 20 is followed by a first baking step 30, which activates PAG in the photoresist film. The PAG will promote the solubility of the photoresist when exposed to a solvent in the developing step. The next event is a second exposure (step 40) of the photoresist to the incident radiation, at an energy density greater than or equal to the difference between the threshold required for converting the photoresist to its transparent state, and the energy applied in the first exposure. The second exposure step 40 is followed by a second bake (step 50). After the second baking step 50, the photoresist is developed (step 60) using a solvent to dissolve the areas which have been converted to their soluble state by exposure to the incident radiation. The developing step 60 is followed by further downstream processing steps 70, (e.g., etching, deposition, plating, implantation) to produce the desired device.

In an exemplary process embodiment of FIG. 2, the topmost layer of the substrate 110 is coated with a 0.078 μm thick layer of AR2 anti-reflection coating manufactured by Shipley, LLC of Marlborough, Mass., and a 0.540 μm thick layer of UV6 (deep ultra-violet photoresist) also manufactured by Shipley LLC. UV6 is a positive photoresist, so that the exposed areas are removed in the developing process. However, as will be clear to those skilled in the art, a negative photoresist may also be used.

In the exemplary embodiment of FIG. 2, first exposure step 20 is done through binary mask 140, which has features which are either fully transparent or fully opaque. The features in the binary mask 140 are also larger than the eventual feature size to be created in the photoresist 120. The features in the binary mask 140 are then imaged onto the surface of the photoresist 120 using the 4× reduction lens 150. For example, in this exemplary embodiment, a 60 nm binary bias mask is used. That is, the binary mask 140 has 880 nm features which are either fully transparent or fully opaque. These 880 nm features translate to 220 nm features at the wafer surface, after projection through the 4×-reduction lens 150. Thus, a mask 140 is used with a 60 nm bias, that is, the openings are 60 nm larger (220 nm) than the eventual dimensions of the features on the photoresist, which will be 0.16 μm (220 nm−60 nm=160 nm). The purpose of the larger featured binary mask 140, is to provide a tolerance range for the repositioning of the wafer after it has been removed for baking. Therefore, even if there is a slight misalignment of the wafer with respect to its position during the first exposure, the misalignment is likely to fall within the tolerance allowed by the 60 nm binary mask.

The use of a binary mask in this embodiment yields a significant cost savings, as binary masks cost approximately half as much as half tone masks or phase shift masks used in the prior art to create such small features.

The exposure of the photoresist 120 on the substrate 110 in both first exposure step 20 and second exposure step 40 will be performed using an energy density from light source 130 which is less than the threshold energy required to convert the photoresist 120 to its transparent state. In one embodiment, the exposure is performed using an ultra-violet radiation source 130, e.g. a 248 nm source, such as that provided by a scanner of the type ASML 500 available from manufacturer ASML Holding NV of Veldhoven, The Netherlands. For the type of photoresist described above, the radiation dose suggested by ASML to be applied may be 27.5 mj/cm². The dosage for the first exposure step 20 is less than, e.g. approximately 62% of, the suggested dosage recommended by the manufacturer. This dosage is less than the threshold required to convert the photoresist to its transparent state in a single exposure. In other embodiments, the incident energy for the first exposure step 20 may be anywhere in the range of about 50%–80%, or at least 20% less than that required to convert the photoresist in a single exposure.

Therefore, for the first exposing step, the incident energy may be about 17 mj/cm² (62% of 27.5 mj/cm²) and the focal spot may be slightly above (e.g. about 0.1 μm above) the true focal point of the beam. The focal spot is the difference in elevation of the wafer on the adjustable stage 170 with respect to its true focal point. The focal spot can be varied in 0.1 μm increments, by the adjustable stage 170 upon which the wafer is mounted. Therefore, for this first step, the incident energy may be about 62% or about ⅔ of the recommended dose energy, and the elevation may be 0.1 μm above the true focal spot.

A purpose of the first exposure step 20 of FIG. 2 is to irradiate a cone-shaped image on the photoresist 120, wherein the cone has absorbed sufficient energy to convert the top layers of the photoresist 120. The situation is shown diagrammatically in FIG. 3a, which is a cross-sectional side view of the photoresist after a first exposure step 20. The cone-shaped region 200 of the first exposure 20 results from the shadowing effects of the edges of the aperture on the transmitted beam, which means that the maximum beam intensity occurs somewhere near the center of the beam, and the outer edges of the beam are partially obscured by the edges of the mask aperture. Therefore, the portions of the photoresist near the center of the beam reach the threshold intensity required to convert the photoresist, before the outer diameters of the beam. For this reason, the first exposure 20 leaves a latent image in the photoresist, of a roughly cone-shaped region 200 which has been exposed to sufficient energy to become transparent. However, the region 200 does not extend through the bottom of the photoresist 120, but only to an intermediate level indicated by reference number 220, so that the material at the bottom of the photoresist remains unconverted. If the photoresist were to be developed at this point in processing, an aperture 205, shown in FIG. 3c, would be formed in the top of the photoresist layer, however there would be no aperture at the bottom of the film, because the converted region 200 does not extend to the bottom of the film. The diameter of top aperture 205 of may be determined by the width of the beam transmitted through the binary mask, which at the wafer surface may be about 0.22 μm wide.

Returning to FIG. 2, the substrate 110 and photoresist 120 are baked in step 30 for 90 seconds at between 110° C. and 140° C., e.g. at 130° C. Baking activates the PAG in the photoresist which promotes the solubility of the photoresist during the developing process. The photoresist may shrink during the baking, by releasing moisture to the environment. The shrinkage may help to reduce the thickness of the remaining unexposed layers of photoresist for subsequent exposures.

The substrate 110 is then reinserted into the photolithography chamber, and is readjusted using stage 170 to be within a certain tolerance, generally within 20–45 nm of the original focal spot. The wafer is then illuminated for the second time in step 40 of FIG. 2, with another 17 mj/cm² of incident energy. Again, this dosage is less than the amount required to convert the photoresist to its transparent state, in a single exposure.

FIGS. 3a–3c illustrate the effects of the double exposure process on the photoresist 120. FIGS. 3a illustrates the first exposure step 20, and FIG. 3b is a cross-sectional side view of the photoresist after a second exposure 40 of the photoresist 120. To clear the lower regions of the photoresist requires the second exposure step 40, which forms a second, inner region 210 shown in FIG. 3b. The second exposure roughly overlaps the first, within some tolerance, and again the outer diameters of the beam may contain less energy than the inner diameters because of the shadowing effects of the mask on the beam. However for the second, inner region 210, the beam energy profile may be further convolved with the cone-shaped outer region 200 (FIG. 3a) left by the first exposure step 20, because the center rays of the beam in the second exposure may traverse mainly transparent photoresist material left by the first exposure, near the center of the cone. Upon developing the photoresist, the clear areas will be dissolved and leave an aperture at the top 205 and the bottom 215 of the photoresist, as shown in the top plan view of FIG. 3c. Therefore, upon reaching the target depth for the aperture, the center of the irradiating beam may have undergone less attenuation and may therefore achieve the threshold energy more readily than the outer portions. Therefore, the diameter of the aperture at the bottom 215 of the converted area in the photoresist is smaller than the aperture at the top 205 of the photoresist, and smaller than what could conventionally be produced using the same radiation source.

The second, inner region 210, therefore, may define the bottom aperture 215 of the contact with a diameter that is narrower than the top aperture 205 in the photoresist. The second, inner region 210 of the second exposure 40 has received approximately 120% of the required dosage to convert the photoresist, whereas the cone-shaped outer region 200 of the first exposure 20 has received only approximately 62% of the required dosage. Therefore, the second exposure may define the eventual 0.16 μm aperture 215 at the bottom of the contact.

FIGS. 3a–3c also demonstrate why the thickness of the photoresist is a factor in determining the final width of the aperture 215 created by the photoresist mask 140. Because of the finite cone angle of the second, inner region 210 in the photoresist 120, the top aperture 205 in the top of the photoresist is in general wider than the bottom aperture 215 created in the bottom of the photoresist. Therefore the aperture size at the bottom aperture 215 of the photoresist film may be a function of its thickness. Reducing the thickness of the film may reduce the variability in the final aperture size. Therefore, thinner films may have a smaller variability than thicker films, and result in a wider process window.

Returning to FIG. 2, in step 50, the photoresist film is baked a second time. This second baking step may be performed at 110° C.–140° C., e.g. 130° C., for 60–90 seconds, e.g. 90 seconds. As with the first baking step, the second baking step 50 may help to shrink the film, which may reduce the film thickness and further open up the bottom apertures. The wafer is then developed in step 60, using a solvent to dissolve the exposed areas of photoresist. In step 70, the wafer is subjected to further, downstream processing through the openings in the photoresist mask, such as plasma etching, deposition, ion implantation, or some other processing step performed through a photoresist mask.

In other embodiments, the energy density of the radiation in the first exposing can be anywhere from 20% to 80% of that required to convert the photoresist. The remainder of the required energy will then be delivered to the photoresist in the second exposing. In other words, the photoresist is exposed to a first incident energy at approximately 20–80% of that required to create features with a single exposure, and then the photoresist is exposed to a second incident energy that is approximately equal to the difference between the energy used in the first exposing, and that required to create features with a single exposure.

Using the double exposure/double bake process as outlined in FIG. 2, may lead to the creation of features on the photoresist mask which are substantially smaller than the features in the binary mask used to expose the photoresist film. The reasons for this improvement are the double exposure, wherein the image left by the second exposure is convolved with the image left by the first exposure, along with the double baking steps which reduce the thickness of the photoresist for the second exposure. For instance, features as small as 0.16 μm can be created using a binary mask with binary apertures which are 0.880 μm wide.

While the characteristic dimensions of the features created in the photoresist mask may be smaller than the aperture size in the binary mask, the characteristic dimensions are also dependent on the radiation dosage and energy density. For a process to be viable in a manufacturing environment, the process needs to have an output which remains within an acceptable range throughout a given input range. The input parameter range reflects the tolerance control of the input parameters. It may be of interest to our readers, therefore, to evaluate the sensitivity of the process results to a range of input parameters, that is, the characteristic dimensions of the contact hole as a function of radiation dosage and energy density. We discuss such testing below.

To evaluate this sensitivity, the characteristic dimension is measured after varying the incident energy and energy density across an array of points in a test matrix on the surface of a test wafer. The range over which the characteristic feature size is within the desired range, is the process latitude.

The test array pattern may be written by varying the second exposure dosage for each point on a test wafer. For this series of exposures, features may be created in an array by using different incident energies and different focal spots for each point in the array. The incident energy may be varied by 1.5 mj/cm$^2$ for each column of features in the array, for example, with the center exposure being 17 mj/cm$^2$. The focal spot may be varied by 0.1 μm by moving the stage carrying the wafer up and down by 0.1 μm per row in the array. As a result, a wafer may be created with an array of features (contact holes) of varying size, as a function of incident energy and energy density (focal spot). Therefore, the array may contain information used to determine the process latitude, in terms of acceptable values of incident energy and focal spot, to produce a feature with a given dimension.

The array features are measured using a VERASEM 3D Scanning Electron Microscope (SEM) manufactured by Applied Materials, Inc. of Santa Clara, Calif. The SEM is used to measure each of the contact holes in the array, in terms of the contact hole diameter. It is also used to evaluate the roundness and cross sectional shape of the contact holes made in the wafer.

EXPERIMENT 1

A first wafer, test wafer #1, was processed according to the flow chart shown in FIG. 2. The wafer is formed of silicon and provided with a layer of polysilicon to a depth of about 80 nm. A layer of an anti-reflection coating and deep UV photoresist are then provided, as set forth in the above discussion. Because polysilicon has a relatively rough surface topography, the edge definition of features created on the polysilicon surface can be expected to be somewhat less well defined than features created on a smooth surface of, for example, bare silicon. A second test wafer, test wafer #2 is a bare silicon wafer having the same anti-reflection coating and deep UV resist layer. However, the second wafer is exposed with a single exposure and processed using a single bake following the exposure to provide a comparison with the double exposure/double bake method applied to test wafer #1. The test array pattern on test wafer #2 was created using an exposure energy of 32 mj/cm$^2$, with 0.1 μm as the center exposure, and varying the exposure energy by 1.5 mj/cm$^2$ per column and the focus by 0.1 μm per row in the test array.

FIG. 4a shows the data measured on the polysilicon-coated test wafer #1 which was subjected to double exposure/double bake process according to FIG. 2. The process latitude is defined as the range of input parameters which results in an acceptable feature size, where the acceptable range is the target range +/−10%. Therefore, a process latitude is the range of input parameters which yields a contact hole which is 0.160 μm +/−0.016 μm. As can be seen from the data for the test array, the process latitude for creating the 0.16 μm spot size is from −0.1 μm focus (measured contact hole size is 0.152 μm) to 0.3 μm focus (measured contact hole size is 0.149 μm), so that the process latitude for depth of focus is about 0.5 μm. Similarly, the exposure latitude is from about 14 mj/cm$^2$ to 17 mj/cm$^2$, for a +/−1.5 mj/cm$^2$ exposure latitude to create the 0.16 μm spots. The 1.5 mj/cm$^2$ latitude is equivalent to 8.1% at 0.18 μm contacts (with the center energy at 18.5 mj/cm$^2$), and 8.8% at the 0.17 μm contacts (with the center energy at 17 mj/cm$^2$) and 9.9% at the 0.16 μm contacts (with the center energy at 15.5 mj/cm$^2$). Since a process window of +/−10% is standard in the industry, the double exposure/double bake method outlined in FIG. 2 has adequate process latitude, compared with existing industry processes, despite creating features which are substantially (e.g. 60 nm) smaller than those created by the existing industry processes using the same photoresist and lithographic equipment. These results are attributable to the novel process, which uses a double exposure and double bake to widen the process window for creation of the small features.

In the case of the single exposure/single bake wafer, test wafer #2, the data is shown in FIG. 4b. A 0.3 μm depth of focus process latitude is found for the 0.18 μm contacts, and essentially no depth of focus latitude for the 0.16 μm contacts. Using a center exposure of 32 mj/cm$^2$, it can be seen from the data that there is well under 10% exposure latitude for the 0.16, 0.17 and 0.18 μm contacts. Therefore the double exposure/double baked wafer demonstrates a wider process latitude than the single exposure wafer with a single bake.

EXPERIMENT 2

A third wafer, test wafer #3, is a bare silicon wafer with an anti-reflection coating and deep UV resist layers, as discussed above. Test wafer #3 is processed using a single exposure, but with a double bake, to compare the effects of the different exposure processes with the same baking procedure. The results are similar to those found for the single exposure, single baked wafer, test wafer #2, shown in FIG. 4b. The results for this test wafer #3 are given in FIG. 5. As can be seen from the data, a 0.4 μm focus process latitude is shown for the 0.18 μm contacts, but there is little process latitude in exposure energy, and little focus latitude for the other target contact dimensions. Therefore, a photoresist process with a second exposure followed by a second baking step results in a wider process latitude, than photoresist process with a single exposure followed by a double bake step.

EXPERIMENT 3

Finally, two more silicon wafers, test wafers #4 and #5, each coated with an 80 nm layer of polysilicon, an anti-reflection coating and a deep UV photoresist layer, were processed according to the method of FIG. 2, and printed with the test array of points as described above in relation to FIG. 4a. The center of the process window for the second exposure was 18.5 mj/cm², and 0.1 μm focus for these data, and the target contact hole size was 0.18 μm. The exposure was varied by 0.5 mj/cm² per column and 0.1 μm focus per row. The data are shown in FIG. 6, and are presented to show process repeatability and to confirm the findings shown in FIG. 4a. As can be seen from the data, the process yields repeatable results between the two wafers #4 and #5, to within about 3% at the center of the process windows for the target values, and to within about 10% at the edges of the process windows. The process latitude on depth of focus is about 0.5 μm, and the exposure latitude is again about 1.5 mj/cm².

The invention is not limited to the exemplary embodiments described above. For instance, the invention is not limited to the particular photoresist materials, deposition techniques or process parameters, layer thicknesses, or other details; the invention is not limited to the particular shapes of the photoresist mask features or their positioning relative to each other; and the invention is not limited to particular materials for the wafer or the layers applied thereon. To the extent that any features of the present invention have been explained or described in relation to beliefs or theories, it should be understood that the invention is not bound to any particular belief or theory. Other embodiments and variations are within the scope of the invention, as defined by the appended claims.

What is claimed is:

1. A method of forming a photoresist mask in a layer of photoresist deposited on a wafer, said method comprising:
   (1) exposing the photoresist through a binary mask to incident energy at approximately 50%–80% of a level required to create features in a single exposure; then
   (2) baking the photoresist; then
   (3) exposing the photoresist through a binary mask to incident energy at approximately 50%–80% of the level required to create features in a single exposure; then
   (4) baking the photoresist; and then
   (5) developing the photoresist, thereby forming said mask.

2. The method of claim 1, wherein the exposing of operation (1) is performed with an incident energy that is approximately 50–60% of that required to create features with a single exposure.

3. The method of claim 1, wherein the exposing of operation (3) is performed with an incident energy that is approximately 50%–60% of that required to create features with a single exposure.

4. The method of claim 1, wherein the exposing of operation (1) is performed through a binary mask with 880 nm features, with a 4× reduction scanner.

5. The method of claim 1, wherein the incident energy is from a 248 nm source.

6. The method of claim 1, wherein the binary mask has dimensions about 25–50% wider than the features to be created in the photoresist.

7. The method of claim 1, wherein the binary mask has dimensions about 37% wider than the features to be created in the photoresist.

8. The method of claim 1, wherein the incident energy is transmitted through an annular aperture which blocks an inner portion of an incident light beam from being transmitted to the substrate.

9. The method of claim 8, wherein the annular aperture blocks the incident light beam within an inner diameter which is about 50–75% of the outer diameter of the beam.

10. The method of claim 8, wherein the annular aperture blocks the incident light beam within an inner diameter which is about 60% of the outer diameter of the beam.

11. A method of forming a photoresist mask in a layer of photoresist deposited on a wafer, said method comprising:
    (1) exposing the photoresist through a binary mask to incident energy at approximately 20–80% of that required to create features with a single exposure; then
    (2) baking the photoresist; then
    (3) exposing the photoresist with an incident energy that is approximately equal to the difference between the energy used in the first exposing (1), and that required to create features with a single exposure; then
    (4) baking the photoresist; then
    (5) developing the photoresist, thereby forming said mask.

12. The method of claim 11, wherein the exposing of operation (1) is performed through a binary mask with 880 nm features, with a 4× reduction scanner.

13. The method of claim 11, wherein the binary mask has dimensions about 25–50% wider than the features to be created in the photoresist.

14. The method of claim 11, wherein the binary mask has dimensions about 37% wider than the features to be created in the photoresist.

15. The method of claim 11, wherein the incident energy is transmitted through an annular aperture which blocks an inner portion of an incident light beam from being transmitted to the substrate.

16. The method of claim 15, wherein the annular aperture blocks the incident light beam within an inner diameter which is about 50–75% of the outer diameter of the beam.

17. A method of forming a photoresist mask in a layer of photoresist deposited on a wafer, said method comprising:
    (1) exposing the photoresist through a mask to incident energy of less than that required to create features in a single exposure; then
    (2) baking the photoresist; then
    (3) exposing the photoresist through a mask to incident energy of less than that required to create features in a single exposure; then
    (4) baking the photoresist; and then
    (5) developing the photoresist to uncover a part of the wafer, thereby forming said photoresist mask.

18. The method of claim 17, wherein the exposure energy of at least one of operations (1) and (3) is at least 20% less than that required to create features in a single exposure.

19. The method of claim 17, wherein the exposure energy of operations (1) and (3) is each at least 20% less than that required to create features in a single exposure.

20. The method of claim 17, wherein the exposure energy of operations (1) and (3) is each about 30%–40% less than that required to create features in a single exposure.

21. The method of claim 17 wherein the masks in operations (1) and (3) are the same mask.

22. The method of claim 21 wherein the photoresist layer has a top surface, and an entire top surface region exposed in operation (1) coincides with an entire top surface region exposed in operation (3).

23. The method of claim 17 wherein the photoresist layer has a top surface, and an entire top surface region exposed in operation (1) coincides with an entire top surface region exposed in operation (3).

24. The method of claim 17 wherein the photoresist layer has a top surface, and a top surface region exposed in operation (1) contains an entire top surface region exposed in operation (3) and is larger than the entire top surface region exposed in operation (3).

25. The method of claim 17 wherein the photoresist layer has a top surface, and a top surface region exposed in operation (3) contains an entire top surface region exposed in operation (1) and is larger than the entire top surface region exposed in operation (1).

26. The method of claim 17 wherein the photoresist is a positive photoresist.

27. The method of claim 17 wherein the photoresist is a negative photoresist.

28. The method of claim 17 further comprising forming said layer of the photoresist before operation (1), wherein the developing operation (5) is not preceded by any single exposure of the photoresist to incident energy sufficient to create features in a single exposure of the photoresist layer formed before operation (1).

29. The method of claim 17 wherein the developing operation (5) is not preceded by any exposure of the photoresist other than the exposing operations (1) and (3).

30. The method of claim 17 wherein at least one of the masks in operations (1) and (3) is a binary mask.

31. The method of claim 17 wherein the photoresist mask and the uncovered part of the wafer reproduce a pattern defined by at least one of the masks in operations (1) and (3).

32. The method of claim 31 wherein the masks in operations (1) and (3) define the same pattern on the photoresist.

* * * * *